(12) United States Patent
Kim

(10) Patent No.: US 12,348,205 B2
(45) Date of Patent: Jul. 1, 2025

(54) AMPLIFIER CIRCUIT

(71) Applicant: SAMSUNG ELECTRONICS CO., LTD., Suwon-si (KR)

(72) Inventor: Kyunghwan Kim, Hwaseong-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 525 days.

(21) Appl. No.: 17/726,961

(22) Filed: Apr. 22, 2022

(65) Prior Publication Data

US 2022/0345099 A1 Oct. 27, 2022

(30) Foreign Application Priority Data

Apr. 23, 2021 (KR) ........................ 10-2021-0053106

(51) Int. Cl.
  *H03F 3/45* (2006.01)
  *H03F 1/26* (2006.01)
  *H03F 3/68* (2006.01)

(52) U.S. Cl.
  CPC ........... *H03F 3/45475* (2013.01); *H03F 1/26* (2013.01); *H03F 3/68* (2013.01)

(58) Field of Classification Search
  CPC ........... H03F 3/45475; H03F 1/26; H03F 3/68
  USPC .......................................................... 330/9
  See application file for complete search history.

(56) References Cited

U.S. PATENT DOCUMENTS

| | | |
|---|---|---|
| 5,963,495 A | 10/1999 | Kumar |
| 6,392,449 B1 | 5/2002 | Taft |
| 6,727,839 B2 | 4/2004 | Mulder et al. |
| 7,768,321 B2 | 8/2010 | Chang et al. |
| 8,810,282 B2 | 8/2014 | Li |
| 9,755,655 B1 | 9/2017 | Hudner |
| 9,852,783 B1 | 12/2017 | Na et al. |
| 10,348,252 B2 | 7/2019 | Jeong et al. |
| 10,461,726 B2 | 10/2019 | Verdant |
| 10,833,689 B2 | 11/2020 | Amaya Beltran et al. |
| 2020/0052586 A1* | 2/2020 | Price ........................ H03K 5/24 |

(Continued)

FOREIGN PATENT DOCUMENTS

| | | |
|---|---|---|
| KR | 10-0834933 | 5/2008 |
| KR | 10-2019-0001769 A | 1/2019 |
| KR | 10-2019-0053854 A | 5/2019 |

OTHER PUBLICATIONS

T. Kobayashi, et al., "A current-mode latch sense amplifier and a static power having input buffer for low-power architecture", 1992 Symposium on VLSI Circuits Digest of Technical Papers.

(Continued)

*Primary Examiner* — Hafizur Rahman
(74) *Attorney, Agent, or Firm* — MORGAN, LEWIS & BOCKIUS LLP

(57) ABSTRACT

An amplifier circuit includes an input circuit configured to receive the first and second input signals and control signal levels of first and second nodes, an output circuit configured to generate signal levels of first and second output signals based on the signal level of the first node and the signal level of the second node, a charge circuit configured to precharge the first and second nodes or discharge the first and second nodes based on a logic level of a control signal, and a reset circuit configured to maintain the signal levels of the first and second output signals at previously determined signal levels based on the logic level of the control signal.

20 Claims, 13 Drawing Sheets

(56) References Cited

U.S. PATENT DOCUMENTS

2020/0259474 A1\*  8/2020  Ippolito ................. H03F 3/393
2020/0373931 A1  11/2020  Omran et al.
2020/0395072 A1  12/2020  Penney

OTHER PUBLICATIONS

Behzad Razavi, "The StrongARM Latch [A Circuit for All Seasons", IEEE Solid-State Circuits Magazine (vol. 7, Issue: 2, Spring 2015).

Office Action dated Mar. 26, 2025 issued in corresponding Korean Patent Application No. 10-2021-0053106.

\* cited by examiner

RESET OPERATION (CTRL=0)

LATCH OPERATION (CTRL=1)

_US 12,348,205 B2_

AMPLIFIER CIRCUIT

CROSS-REFERENCE TO RELATED APPLICATION

This application is based on and claims priority under 35 U.S.C. § 119 to Korean Patent Application No. 10-2021-0053106, filed on Apr. 23, 2021 in the Korean Intellectual Property Office, the disclosure of which is incorporated by reference herein in its entirety.

TECHNICAL FIELD

Embodiments of the inventive concept relate to an amplifier circuit, and more particularly, to an amplifier circuit that consumes a small amount of power and provides a fast sensing time.

DISCUSSION OF RELATED ART

An integrated circuit may include a comparator circuit or an amplifier circuit that compares signals generated externally or internally, and outputs results of the comparison. For example, the integrated circuit may be an analog-to-digital converter, a sense amplifier included in a memory device, a regulator, or a digital interface circuit. As the degree of integration of integrated circuits increases, the demand for a comparator circuit or an amplifier circuit that operates using a low voltage and provides a fast comparison operation also increases.

SUMMARY

Embodiments of the inventive concept relate to an amplifier circuit, and provide an amplifier circuit for precharging or discharging a drain terminal of an input transistor according to a control signal.

According to an embodiment of the inventive concept, there is provided an amplifier circuit including an input circuit configured to receive the first and second input signals and control signal levels of first and second nodes; an output circuit configured to generate signal levels of first and second output signals based on the signal level of the first node and the signal level of the second node; a charge circuit configured to precharge the first and second nodes or discharge the first and second nodes based on a logic level of a control signal; and a reset circuit configured to maintain the signal levels of the first and second output signals at previously determined signal levels based on the logic level of the control signal.

According to an embodiment of the inventive concept, there is provided an amplifier circuit including an input circuit configured to receive first and second input signals and control signal levels of first and second nodes; an output circuit configured to generate signal levels of first and second output signals based on the signal level of the first node and the signal level of the second node; a charge circuit configured to precharge the first and second nodes or discharge the first and second nodes based on a logic level of a control signal; and an input switch circuit configured to selectively transfer the first and second input signals to the input circuit based on the logic level of the control signal.

According to an embodiment of the inventive concept, there is provided an amplifier circuit configured to perform a reset operation of maintaining first and second output signals at previously determined signal levels and a latch operation of generating first and second output signals respectively corresponding to the first and second input signals including an input circuit configured to receive the first and second input signals and control signal levels of first and second nodes; an output circuit configured to output first and second output signals in which the signal levels of the first and second input signals are amplified based on the signal levels of the first and second nodes during the latch operation; a charge circuit configured to precharge the first and second nodes during the reset operation and discharge the first and second nodes during the latch operation; and a reset circuit configured to maintain signal levels of the first and second output signals at signal levels corresponding to half of a sum of a positive power voltage and a negative power voltage during the reset operation.

BRIEF DESCRIPTION OF THE DRAWINGS

Embodiments of the inventive concept will be more clearly understood from the following detailed description taken in conjunction with the accompanying drawings, in which.

DETAILED DESCRIPTION OF THE EMBODIMENTS

Figure 1A:
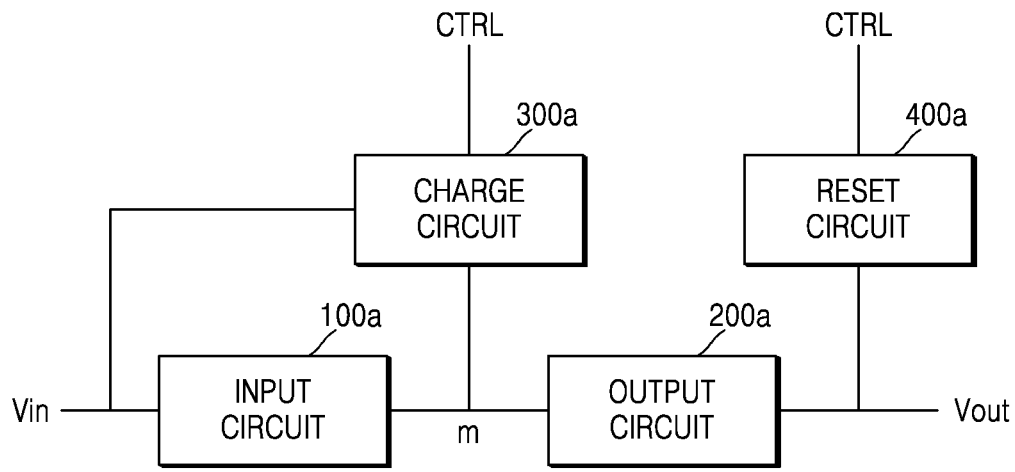
FIG. 1A is a block diagram illustrating an amplifier circuit according to an embodiment of the inventive concept.

Hereinafter, various embodiments of the inventive concept will be described with reference to the accompanying drawings. Like reference numerals may refer to like elements throughout the accompanying drawings.

It will be understood that the terms "first," "second," "third," etc. are used herein to distinguish one element from another, and the elements are not limited by these terms. Thus, a "first" element in an embodiment may be described as a "second" element in another embodiment.

It should be understood that descriptions of features or aspects within each embodiment should typically be considered as available for other similar features or aspects in other embodiments, unless the context clearly indicates otherwise.

As used herein, the singular forms "a", "an" and "the" are intended to include the plural forms as well, unless the context clearly indicates otherwise.

It will be understood that when a component is referred to as being "connected to" another component, it can be directly connected to the other component, or intervening components may be present. Other words used to describe the relationships between components should be interpreted in a like fashion.

Herein, when one value is described as being about equal to another value, it is to be understood that the values are identical, the values are equal to each other within a measurement error, or if measurably unequal, are close enough in value to be functionally equal to each other as would be understood by a person having ordinary skill in the art. For example, the term "about" as used herein is inclusive of the stated value and means within an acceptable range of deviation for the particular value as determined by one of ordinary skill in the art, considering the measurement in question and the error associated with measurement of the particular quantity (i.e., the limitations of the measurement system). For example, "about" may mean within one or more standard deviations as understood by one of the ordinary skill in the art. Further, it is to be understood that while parameters may be described herein as having "about" a certain value, according to embodiments, the parameter may be exactly the certain value or approximately the certain value within a measurement error as would be understood by a person having ordinary skill in the art.

As is traditional in the field of the inventive concept, embodiments are described, and illustrated in the drawings, in terms of functional blocks, units and/or modules. Those skilled in the art will appreciate that these blocks, units and/or modules are physically implemented by electronic (or optical) circuits such as logic circuits, discrete components, microprocessors, hard-wired circuits, memory elements, wiring connections, etc., which may be formed using semiconductor-based fabrication techniques or other manufacturing technologies. In the case of the blocks, units and/or modules being implemented by microprocessors or similar, they may be programmed using software (e.g., microcode) to perform various functions discussed herein and may optionally be driven by firmware and/or software. Alternatively, each block, unit and/or module may be implemented by dedicated hardware, or as a combination of dedicated hardware to perform some functions and a processor (e.g., one or more programmed microprocessors and associated circuitry) to perform other functions.

FIG. 1A is a block diagram illustrating an amplifier circuit 10a according to an embodiment of the inventive concept.

Referring to FIG. 1A, the amplifier circuit 10a may receive an input signal Vin and output an output signal Vout. In this specification, a signal may mean a current or a voltage, but embodiments are not limited thereto. The amplifier circuit 10a may be an amplifier circuit that generates the output signal Vout by amplifying a signal level of the input signal Vin. The amplifier circuit 10a may operate based on a logic level of a control signal CTRL. For example, when the logic level of the control signal CTRL is a first logic level, the amplifier circuit 10a may perform a reset operation of maintaining the signal level of the output signal Vout at a previously determined signal level. When the logic level of the control signal CTRL is a second logic level, the amplifier circuit 10a may perform a latch operation of outputting the output signal Vout obtained by amplifying the signal level of the input signal Vin. In this specification, the first logic level may mean a logic low level, and the second logic level may mean a logic high level.

The amplifier circuit 10a may include an input circuit 100a, an output circuit 200a, a charge circuit 300a, and a reset circuit 400a.

The input circuit 100a may receive the input signal Vin and control a signal level of a middle node m. When the logic level of the control signal CTRL is the first logic level, the charge circuit 300a may precharge the signal level of the middle node m to the signal level of the input signal Vin. The input circuit 100a may discharge the middle node m based on the input signal Vin. Accordingly, the signal level of the middle node m may be different from the signal level of the input signal Vin. In this specification, the signal level may be a voltage level or a current level, but embodiments are not limited thereto.

The charge circuit 300a may precharge or discharge the middle node m based on the logic level of the control signal CTRL. For example, when the logic level of the control signal CTRL is the first logic level, the charge circuit 300a may precharge the middle node m to the signal level of the input signal Vin. When the logic level of the control signal CTRL is the second logic level, the charge circuit 300a may discharge the middle node m precharged to the signal level of the input signal Vin. That is, the middle node m may be associated with the signal level of the input signal Vin by the charge circuit 300a.

The output circuit 200a may generate the output signal Vout based on the signal level of the middle node m. For example, when the logic level of the control signal CTRL is the second logic level, the signal level of the middle node m may decrease by the input circuit 100a and the charge circuit 300a, and the signal level of the output signal Vout may be stabilized according to a speed at which the signal level of the middle node m decreases. In an embodiment, a time during which the signal level of the output signal Vout is stabilized may be referred to as a sensing time. For example, when the signal level of the middle node m decreases relatively quickly, the sensing time may be relatively short, and when the signal level of the middle node m decreases relatively slowly, the sensing time may be relatively long. That is, according to an embodiment of the inventive concept, because the sensing time may be shortened as the magnitude of the input signal Vin is small, the amplifier circuit 10a may provide high performance even with a small amount of power.

The reset circuit 400a may maintain the output signal Vout at a previously determined signal level based on the logic level of the control signal CTRL. For example, when the logic level of the control signal CTRL is the first logic level, the reset circuit 400a may perform a reset operation of maintaining the output signal Vout at the previously determined signal level (e.g., about half of supply power VDD). When the logic level of the control signal CTRL is the second logic level, the reset circuit 400a may stop the reset operation, and the output signal Vout amplified based on the input signal Vin may be output from the output circuit 200a.

The amplifier circuit 10a according to an embodiment of the inventive concept may provide high sensing performance even with low power consumption by precharging the signal level of the middle node m based on the input signal Vin.

Figure 1B:
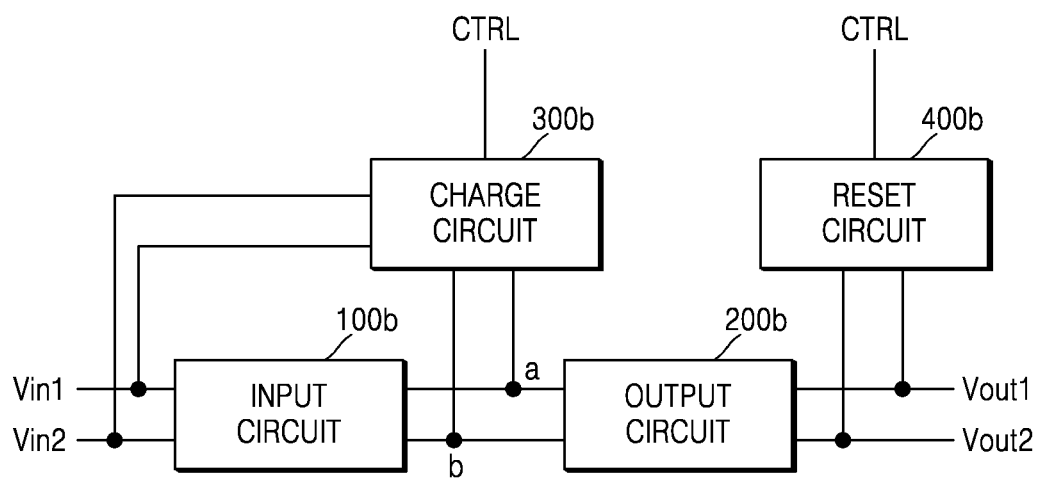
FIG. 1B is a block diagram illustrating an amplifier circuit according to an embodiment of the inventive concept.

FIG. 1B is a block diagram illustrating an amplifier circuit 10b according to an embodiment of the inventive concept.

Referring to FIG. 1B, the amplifier circuit 10b may be a differential amplifier circuit that receives first and second input signals Vin1 and Vin2 and outputs first and second output signals Vout1 and Vout2. Like the amplifier circuit 10a of FIG. 1A, when a logic level of the control signal CTRL is a first logic level, the amplifier circuit 10b may perform a reset operation of maintaining signal levels of the first and second output signals Vout1 and Vout2 to a previously determined signal level. For example, in the reset operation, the first and second output signals Vout1 and Vout2 may each have a signal level corresponding to about half of the positive supply power VDD. When the logic level of the control signal CTRL is a second logic level, the amplifier circuit 10b may perform a latch operation of outputting the first and second output signals Vout1 and Vout2 obtained by amplifying the signal levels of the first and second input signals Vin1 and Vin2. Because a signal level difference between the first and second output signals Vout1 and Vout2 may be greater than a signal level difference between the first and second input signals Vin1 and Vin2, the amplifier circuit 10b may be referred to as a comparator circuit that outputs results of a comparison operation between the first and second input signals Vin1 and Vin2. In this specification, it may be described later that the signal level of the second input signal Vin2 is higher than the signal level of the first input signal Vin1, but embodiments are not limited thereto.

The amplifier circuit 10b may include an input circuit 100b, an output circuit 200b, a charge circuit 300b, and a reset circuit 400b.

The input circuit 100b may receive the first and second input signals Vin1 and Vin2 and may be connected to first and second middle nodes a and b. For example, the input circuit 100b may include transistors receiving the first and second input signals Vin1 and Vin2 in gate terminals, and the first and second middle nodes a and b may be connected to drain terminals of the transistors. Accordingly, the input circuit 100b may discharge the first middle node a based on the first input signal Vin1 and discharge the second middle node b based on the second input signal Vin2. The higher the signal level of the input signal, the faster the middle node may be discharged. In some embodiments, because the signal level of the second input signal Vin2 is higher than the signal level of the first input signal Vin1, the second middle node b may be discharged faster. When a logic level of the control signal CTRL transitions from the first logic level to the second logic level, the second middle node b may be in a more discharged state than the first middle node a. When the logic level of the control signal CTRL is the first logic level, the charge circuit 300b may precharge the first middle node a to the signal level of the second input signal Vin2 and precharge the second middle node b to the signal level of the first input signal Vin1. That is, when the logic level of the control signal CTRL transitions from the first logic level to the second logic level, the signal level difference between the first and second middle nodes a and b may be greater than the signal level difference between the first and second input signals Vin1 and Vin2.

The charge circuit 300b may precharge or discharge the first and second middle nodes a and b based on the logic level of the control signal CTRL. For example, when the logic level of the control signal CTRL is the first logic level, the charge circuit 300b may precharge the first middle node a to the signal level of the second input signal Vin2, and may precharge the second middle node b to the signal level of the first input signal Vin1. That is, the signal levels precharged in the first and second middle nodes a and b may be different.

When the logic level of the control signal CTRL is the second logic level, the charge circuit 300b may discharge the first and second middle nodes a and b that are precharged to the signal levels of the second and first input signals Vin2 and Vin1.

When the logic level of the control signal CTRL transitions from the first logic level to the second logic level by the charge circuit 300b and the input circuit 100b, the signal level of the second middle node b may be in a state lower than the signal level of the middle node a. The logic level of the control signal CTRL is maintained at the second logic level, the second middle node b may be discharged faster than the first middle node a.

The reset circuit 400b may maintain the first and second output signals Vout1 and Vout2 at previously determined signal levels based on the logic level of the control signal CTRL. For example, when the logic level of the control signal CTRL is the first logic level, the reset circuit 400b may perform a reset operation of maintaining the first and second output signals Vout1 and Vout2 to previously determined signal levels (e.g., about half of the supply power VDD). When the logic level of the control signal CTRL is the second logic level, the reset circuit 400b may stop the reset operation.

When the logic level of the control signal CTRL is the second logic level, the output circuit 200b may generate the first and second output signals Vout1 and Vout2 based on the signal levels of the first and second middle nodes a and b that are discharged. The signal levels of the first and second output signals Vout1 and Vout2 may be determined as one of the positive supply power VDD or a negative supply power VSS. In some embodiments, when the logic level of the control signal CTRL transitions to the second logic level, the signal level of the second middle node b may be lower than the signal level of the first middle node a, and thus, the signal level of the second output signal Vout2 corresponding to the second middle node b may be amplified by the negative supply power VSS, and the signal level of the first output signal Vout1 corresponding to the first middle node a may be amplified by the positive supply power VDD. Also, the signal level difference between the first and second middle nodes a and b is greater than the signal level difference between the first and second input signals Vin1 and Vin2, and thus, the first and second output signals Vout1 and Vout2 may be amplified relatively quickly. That is, a sensing time taken to amplify the first and second input signals Vin1 and Vin2 to the first and second output signals Vout1 and Vout2 may be shortened.

Accordingly, the amplifier circuit 10b according to an embodiment of the inventive concept may precharge the signal levels of the first and second middle nodes a and b to the first and second input signals Vin1 and Vin2, thereby reducing the sensing time until the first and second output signals Vout1 and Vout2 are amplified.

Figure 2:
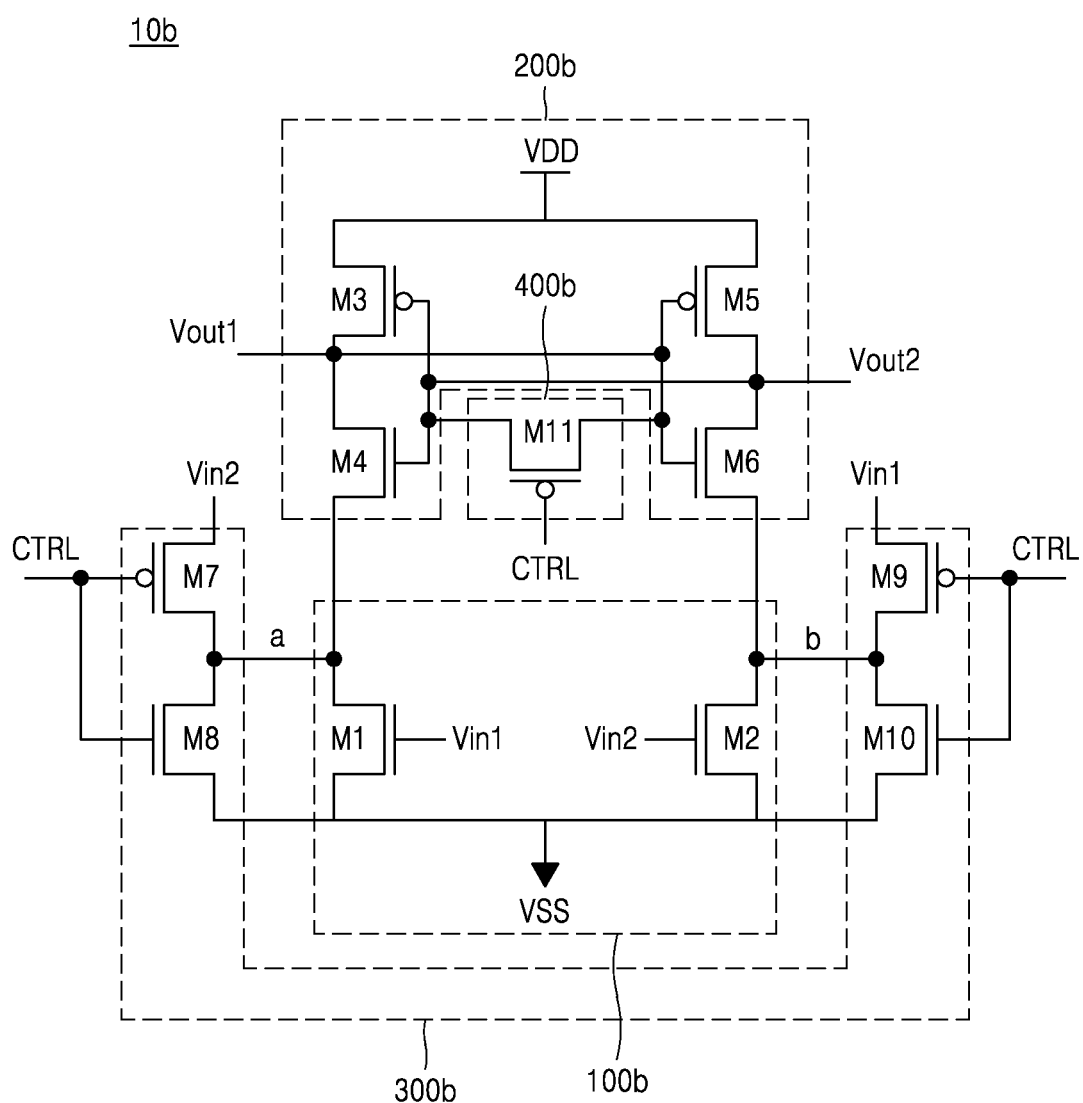
FIG. 2 is a circuit diagram of an amplifier circuit according to an embodiment of the inventive concept.

FIG. 2 is a circuit diagram of an amplifier circuit according to an embodiment of the inventive concept.

For example, FIG. 2 may be a circuit diagram corresponding to the amplifier circuit 10b of FIG. 1B. For convenience of explanation, a further description of components and technical aspects described above with reference to FIG. 1B may be omitted.

Referring to FIG. 2, the input circuit 100b may include first and second transistors M1 and M2. The first and second transistors M1 and M2 may be N-type transistors, but embodiments are not limited thereto. The first input signal Vin1 may be received by a gate terminal of the first transistor M1, the first middle node a may be connected to a drain terminal thereof, and the negative supply power VSS may be connected to a source terminal thereof. In some embodiments, the source terminal may be connected to a ground node. The second input signal Vin2 may be received by a gate terminal of the second transistor M2, the second middle node b may be connected to a drain terminal thereof, and the negative supply power VSS may be connected to a source terminal thereof. In some embodiments, the source terminal may be connected to a ground node.

The output circuit 200b may include third to sixth transistors M3 to M6. The third and fifth transistors M3 and M5 may be P-type transistors, and the fourth and sixth transistors M4 and M6 may be N-type transistors, but embodiments are not limited thereto. The third and fourth transistors M3 and M4 may constitute a first inverter, and the fifth and sixth transistors M5 and 6 may constitute a second inverter. The first inverter and the second inverter may form a cross-connected latch structure. That is, an input terminal of the first inverter and an output terminal of the second inverter may be connected to each other, and an output terminal of the first inverter and an input terminal of the second inverter may be connected to each other. Therefore, when the output signal of the first inverter is the positive supply power VDD, the output signal of the second inverter may be the negative supply power VSS, and when the output signal of the first inverter is the negative supply power VSS, the output signal of the second inverter may be the positive supply power VDD. The input terminal of the first inverter or the output terminal of the second inverter may be a node where the first output signal Vout1 is generated, and the input terminal of the second inverter or the output terminal of the first inverter may be a node where the second output signal Vout2 is generated. The source terminal of the fourth transistor M4 may be connected to the first middle node a, and the source terminal of the sixth transistor M6 may be connected to the second middle node b.

When the second middle node b is discharged faster than the first middle node a, the second output signal Vout2 may be amplified to have a signal level of the negative supply power VSS, and the first output signal Vout1 may be amplified to have a signal level of the positive supply power VDD.

The charge circuit 300b may include seventh to tenth transistors M7 to M10. The seventh and ninth transistors M7 and M9 may be P-type transistors, and the eighth and tenth transistors M8 and M10 may be N-type transistors, but embodiments are not limited thereto. The seventh and eighth transistors M7 and M8 may be connected to each other in series. The seventh and eighth transistors M7 and M8 may be referred to as a first charge circuit that precharges or discharges the first middle node a, and the ninth and tenth transistors M9 and M10 may be referred to as a second charge circuit that precharges or discharges the second middle node b.

The control signal CTRL may be received by a gate terminal of the seventh transistor M7, the second input signal Vin2 may be input to a source terminal thereof, and the first middle node a may be connected to a drain terminal thereof. The control signal CTRL may be received by a gate terminal of the eighth transistor M8, the first middle node a may be connected to a drain terminal thereof, and the negative supply power VSS may be connected to a source terminal thereof. Thus, the source terminal of the eighth transistor M8 may be connected to a ground node (e.g., the node receiving VSS).

When a logic level of the control signal CTRL is a first logic level, the seventh transistor M7 may be turned on, and the first middle node a may be precharged to the second input signal Vin2. When the logic level of the control signal CTRL is a second logic level, the eighth transistor M8 may be turned on and the first middle node a may be discharged. That is, when the signal level of the first input signal Vin1 is low, the first transistor M1 may not be sufficiently turned on, whereas, when the logic level of the control signal CTRL is the second logic level, the first middle node a may be quickly discharged through the eighth transistor M8. In other words, even if the signal level of the first input signal Vin1 is lower than a threshold voltage level of the first transistor M1, the first middle node a may be quickly discharged through the eighth transistor M8. The amplifier circuit 10b may amplify the first output signal Vout1 by securing a discharge path through the eighth transistor M8 even when an input signal of a low signal level is used, and may consume less power.

The control signal CTRL may be received by a gate terminal of the ninth transistor M9, the first input signal Vin1 may be input to a source terminal thereof, and the second middle node b may be connected to a drain terminal thereof. The control signal CTRL may be received by a gate terminal of the ninth transistor M9, the second middle node b may be connected to a drain terminal thereof, and the negative supply power VSS may be connected to a source terminal thereof.

When the logic level of the control signal CTRL is the first logic level, the ninth transistor M9 may be turned on, and the second middle node b may be precharged to the first input signal Vin1. When the logic level of the control signal CTRL is the second logic level, the tenth transistor M10 may be turned on and the second middle node b may be discharged. That is, when the signal level of the second input signal Vin2 is low, the second transistor M2 may not be sufficiently turned on, whereas, when the logic level of the control signal CTRL is the second logic level, the second middle node b may be quickly discharged through the tenth transistor M10. In other words, even if the signal level of the second input signal Vin2 is lower than a threshold voltage level of the second transistor M2, the second middle node b may be quickly discharged through the tenth transistor M10. The amplifier circuit 10b may amplify the second output signal Vout2 by securing a discharge path through the tenth transistor M10 even when an input signal of a low signal level is used, and may consume less power.

The signal level of the second input signal Vin2 is higher than the signal level of the first input signal Vin1, and thus, in the input circuit 100b, the second transistor M2 may permit more channel current than the first transistor M1. Accordingly, the second middle node b may be discharged faster than the first middle node a, the second output signal Vout2 may be amplified to a signal level corresponding to the negative supply power VSS by the second output circuit 200b having a latch structure, and the first output signal Vout1 may be amplified to a signal level corresponding to the positive supply power VDD.

In a state in which the charge circuit 300b precharges the second middle node b to the first input signal Vin1 and precharges the first middle node a to the second input signal Vin2, the first and the first and second middle nodes a and b may be discharged by the two transistors M1 and M2. For example, the first transistor M1 may discharge the first middle node a based on the first input signal Vin1, and the second transistor M2 may discharge the second middle node b based on the second input signal Vin2. The signal level of the second input signal Vin2 is higher than the signal level of the first input signal Vin1, and thus, the second middle node b may be discharged faster than the first middle node a. When the control signal CTRL transitions to the second logic level, a signal level difference between the first and second middle nodes a and b may be in a state greater than a signal level difference between the first and second input signals Vin1 and Vin2. Accordingly, a sensing time taken to amplify the first and second output signals Vout1 and Vout2 during the latch operation may be reduced.

The reset circuit 400b may include an eleventh transistor M11. The eleventh transistor M11 may be a P-type transistor, but embodiments are not limited thereto. The control signal CTRL may be received by a gate terminal of the eleventh transistor M11, and output terminals of the first and second inverters may be connected to a source terminal and a drain terminal thereof. When the logic level of the control signal CTRL is the first logic level, the output terminals of the first inverter and the second inverter are interconnected, and thus, the first and second output signals Vout1 and Vout2 may remain at the same signal level. For example, when the reset operation occurs immediately after the latch operation of maintaining the first and second output signals Vout1 and Vout2 at the signal levels of the positive supply power VDD and the negative supply power VSS, respectively, the first and second output signals Vout1 and Vout2 may have a signal level corresponding to about half of the positive supply power VDD. When the logic level of the control signal CTRL is the second logic level, the eleventh transistor M11 may be turned off, and the output terminals of the first inverter and the second inverter may be disconnected from each other. Accordingly, the output circuit 200b may operate as a latch, and the first and second output signals Vout1 and Vout2 may be amplified based on the signal levels of the first and second middle nodes a and b.

Figure 3A:
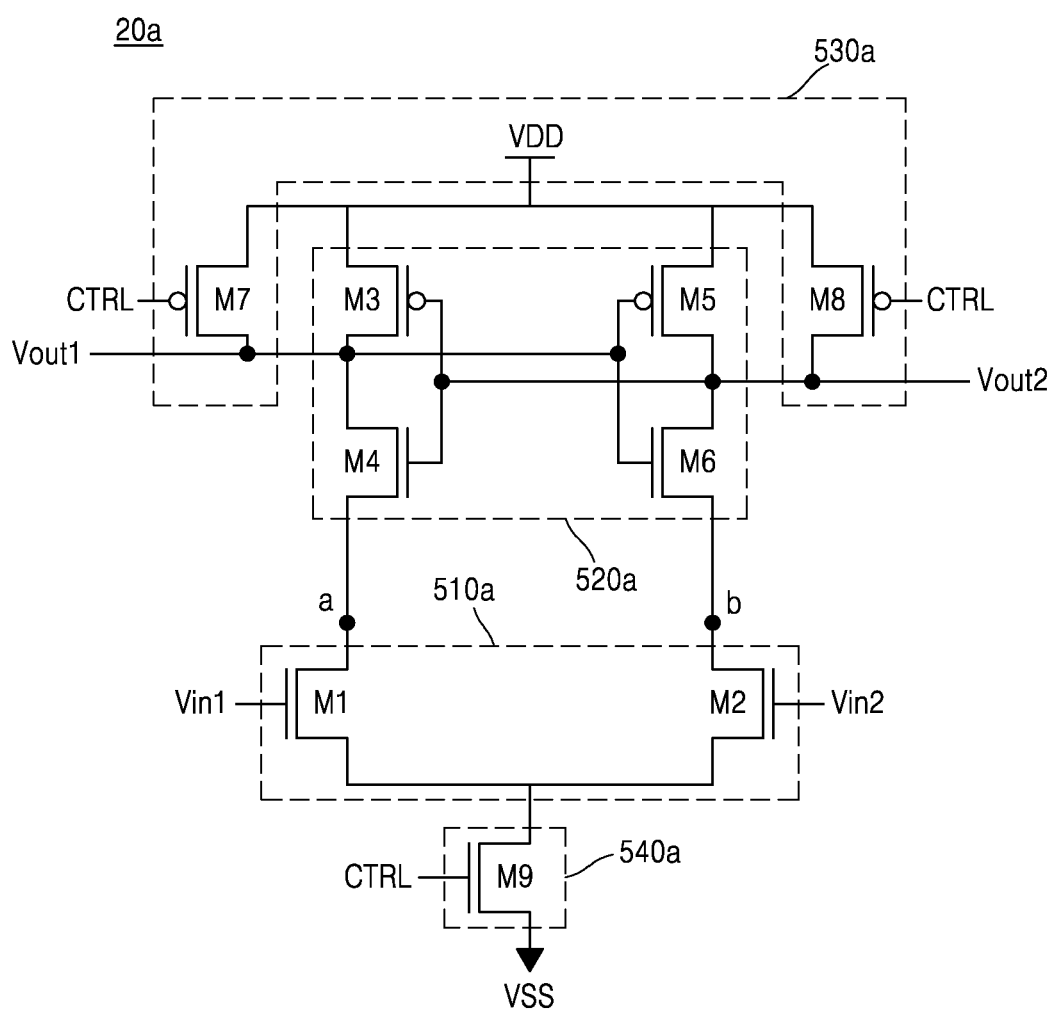
FIGS. 3A and 3B are circuit diagrams illustrating other implementation examples of amplifier circuits according to embodiments of the inventive concept.
Figure 3B:
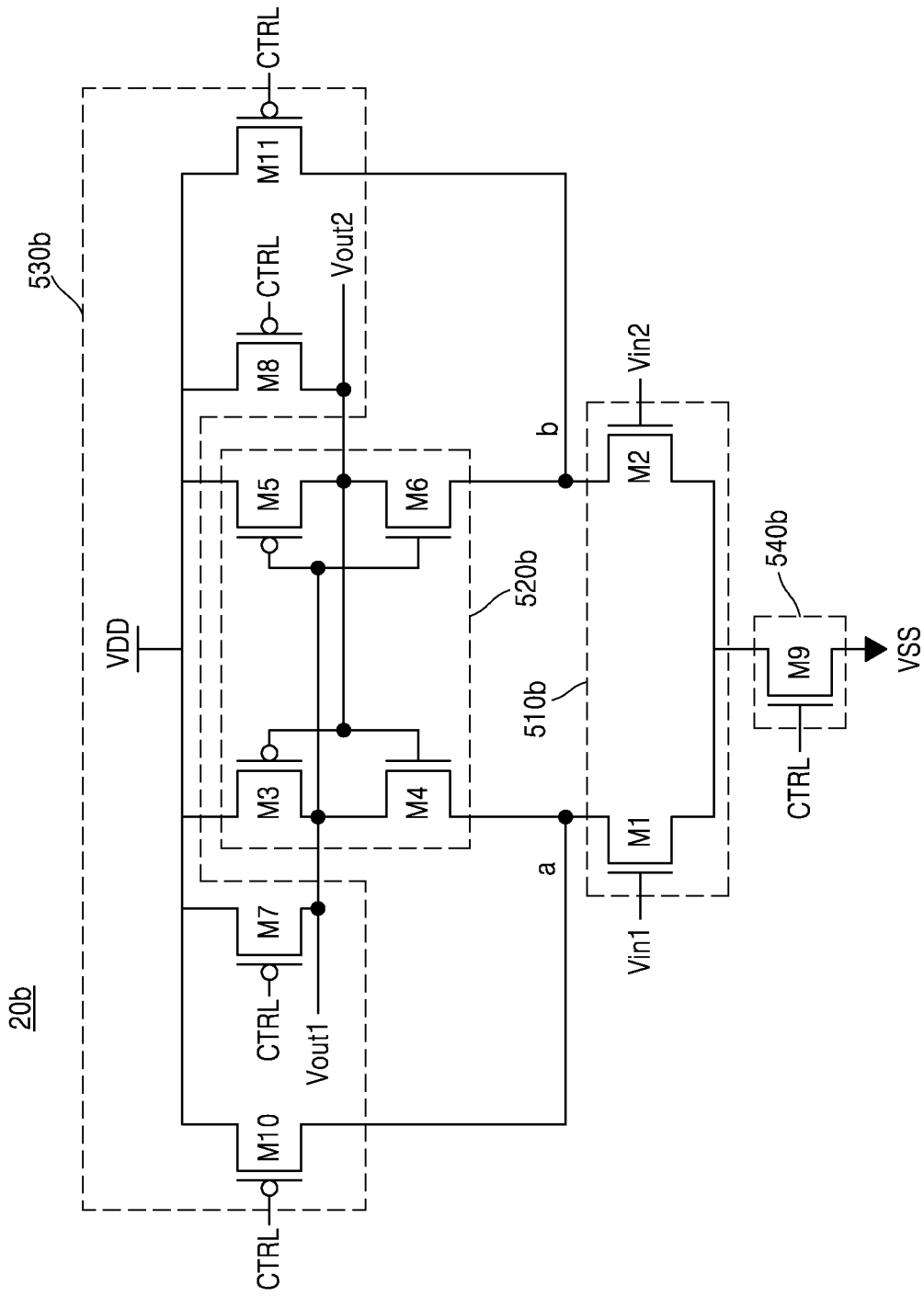

FIGS. 3A and 3B are circuit diagrams illustrating other implementation examples of amplifier circuits according to embodiments of the inventive concept.

Referring to FIG. 3A, an amplifier circuit 20a may include an input circuit 510a, an output circuit 520a, a reset circuit 530a, and a discharge circuit 540a. Referring to FIG. 3B, an amplifier circuit 20b may include an input circuit 510b, an output circuit 520b, a reset circuit 530b, and a discharge circuit 540b.

The input circuit 510a may include the first and second transistors M1 and M2 respectively receiving the first and second input signals Vin1 and Vin2. In an embodiment, the source terminals of the first and second transistors M1 and M2 are not directly connected to the negative supply power VSS, but rather, may be connected to the negative supply power VSS through the discharge circuit 540a.

The output circuit 520a may include the third to sixth transistors M3 to M6. The output circuit 520a may correspond to the output circuit 200b of FIG. 2.

When a logic level of the control signal CTRL is a first logic level, the reset circuit 530a may maintain the first and second output signals Vout1 and Vout2 to the positive supply power VDD. The reset circuit 530a may include the seventh and eighth transistors M7 and M8. The control signal CTRL may be received by a gate terminal of the seventh transistor M7, the positive supply power VDD may be connected to a source terminal thereof, and a node of the first output signal Vout1 may be connected to a drain terminal thereof. The control signal CTRL may be received by a gate terminal of the eighth transistor M8, the positive supply power VDD may be connected to a source terminal thereof, and a node of the second output signal Vout2 may be connected to a drain terminal thereof. In some embodiments, the reset circuit 530a of FIG. 3A may also be applied to the amplifier circuit 10b of FIG. 2. That is, in some embodiments, the reset circuit 530a of FIG. 3A may be included in the amplifier circuit 10b regardless of the reset circuit 400b of FIG. 3A.

The discharge circuit 540a may include the ninth transistor M9. The ninth transistor M9 may discharge the first and second middle nodes a and b based on the logic level of the control signal CTRL. In some embodiments, the discharge circuit 540a of FIG. 3A may also be applied to the amplifier circuit 10b of FIG. 2. Unlike the amplifier circuit 20a of FIG. 3A, in the amplifier circuit 10b of FIG. 2, the first and second middle nodes a and b may be precharged to the first and second input signals Vin1 and Vin2, thereby reducing the sensing time.

Unlike the amplifier circuit 20a of FIG. 3A, referring to the amplifier circuit 20b of FIG. 3B, the reset circuit 530b may further include the tenth and eleventh transistors M10 and M11. The tenth transistor M10 may precharge the first middle node a to the positive supply power VDD based on the logic level of the control signal CTRL, and the eleventh transistor M11 may precharge the second middle node b to the positive supply power VDD based on the logic level of the control signal CTRL.

Unlike the amplifier circuit 20b of FIG. 3B, in the amplifier circuit 10b of FIG. 2, the first and second middle nodes a and b may be precharged to the first and second input signals Vin1 and Vin2 having different signal levels, thereby reducing the sensing time.

Figure 4:
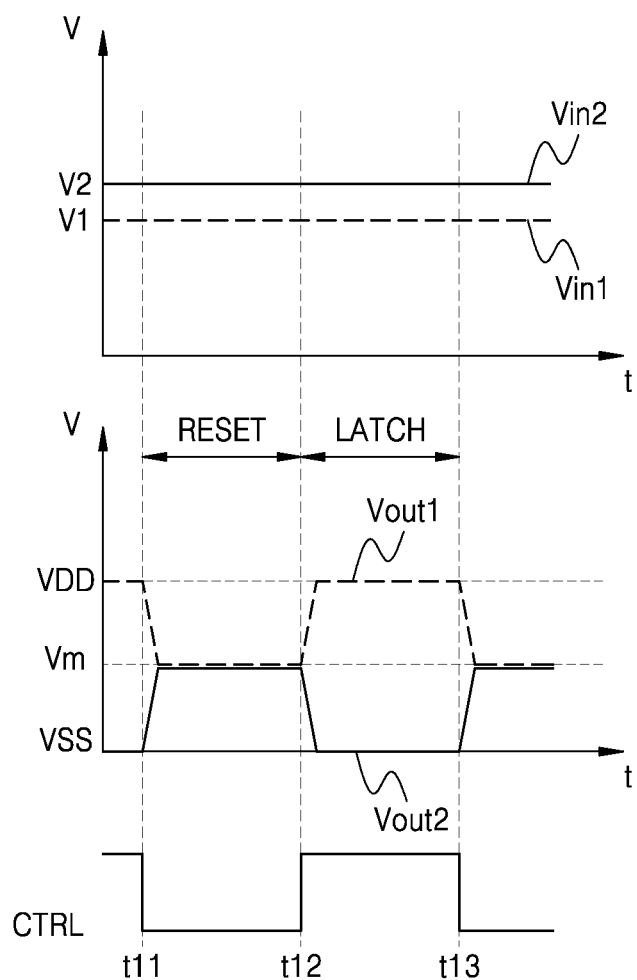
FIG. 4 is a timing diagram illustrating a reset operation and a latch operation according to an embodiment of the inventive concept.

FIG. 4 is a timing diagram illustrating a reset operation and a latch operation according to an embodiment of the inventive concept.

Referring to FIG. 4, a signal level of the first input signal Vin1 may be a first level V1, and a signal level of the second input signal Vin2 may be a second level V2. A time period in which the reset operation is performed may be referred to as a reset period, and a time period in which a latch operation is performed may be referred to as a latch period. Referring to FIGS. 2 and 4, the amplifier circuit 20b may perform the reset operation or the latch operation according to a logic level of the control signal CTRL. For example, the amplifier circuit 20b may perform the reset operation between a first time t11 and a second time t12 where a logic level of the control signal CTRL is a first logic level, and may perform the latch operation between the second time t12 and a third time t13 where the logic level of the second logic level CTRL is a second logic level.

The amplifier circuit 20b may maintain signal levels of the first and second output signals Vout1 and Vout2 at a previously determined signal level during the reset operation. In some embodiments, the first and second output signals Vout1 and Vout2 may remain at a middle voltage Vm, which is a signal level corresponding to about half of the positive supply power VDD.

The amplifier circuit 20b may amplify the first and second output signals Vout1 and Vout2 based on signal levels of the first and second input signals Vin1 and Vin2 during the latch operation. In some embodiments, the second input signal Vin2 may have a signal level higher than that of the first input signal Vin1, but embodiments are not limited thereto.

As described above with reference to FIG. 2, during the latch operation, the second transistor M2 that receives the second input signal Vin2 has a channel current greater than that of the first transistor M1 that receives the first input signal Vin1, and thus, a signal level of the second middle node b may be lower than a signal level of the first middle node a. Accordingly, due to a latch structure of the output circuit 200b, the signal level of the second output signal Vout2 may be the negative supply power VSS, and the signal level of the first output signal Vout1 may be the positive supply power VDD.

Figure 5A:
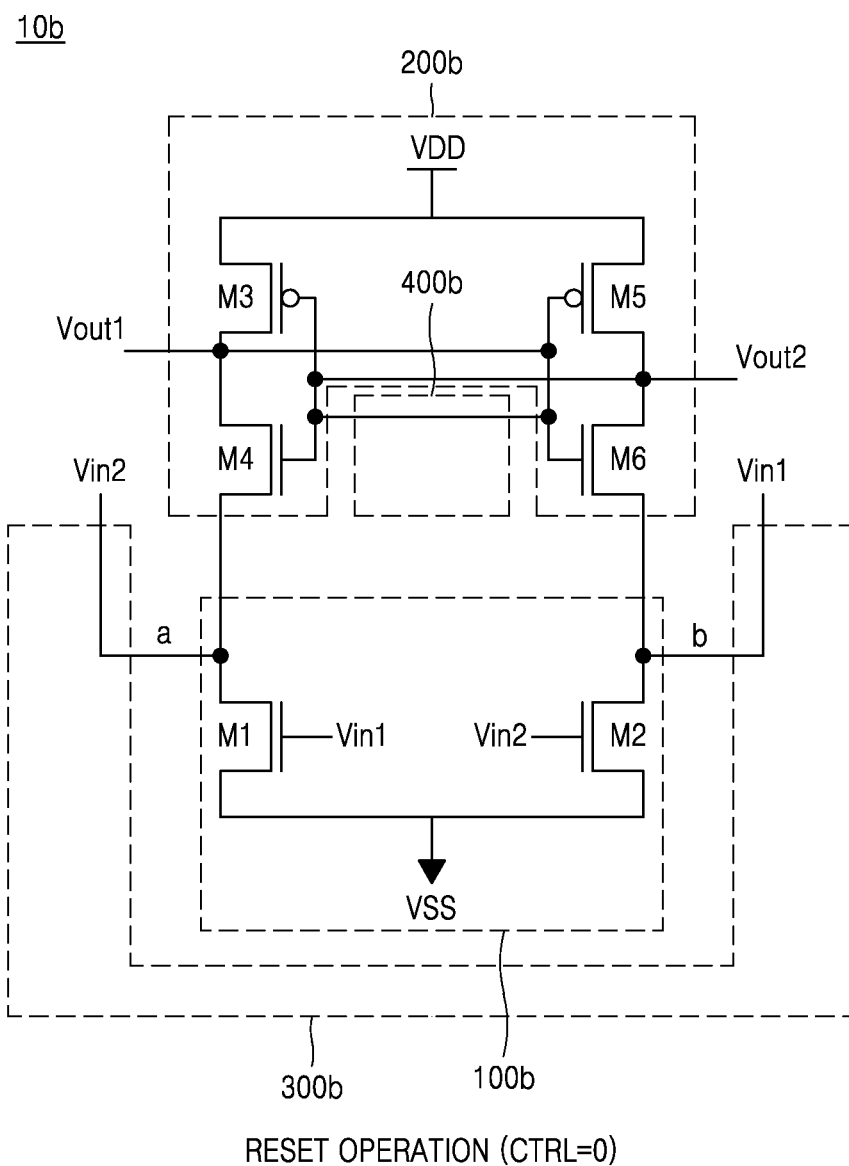
FIGS. 5A and 5B are diagrams illustrating a reset operation according to an embodiment of the inventive concept.
Figure 5B:
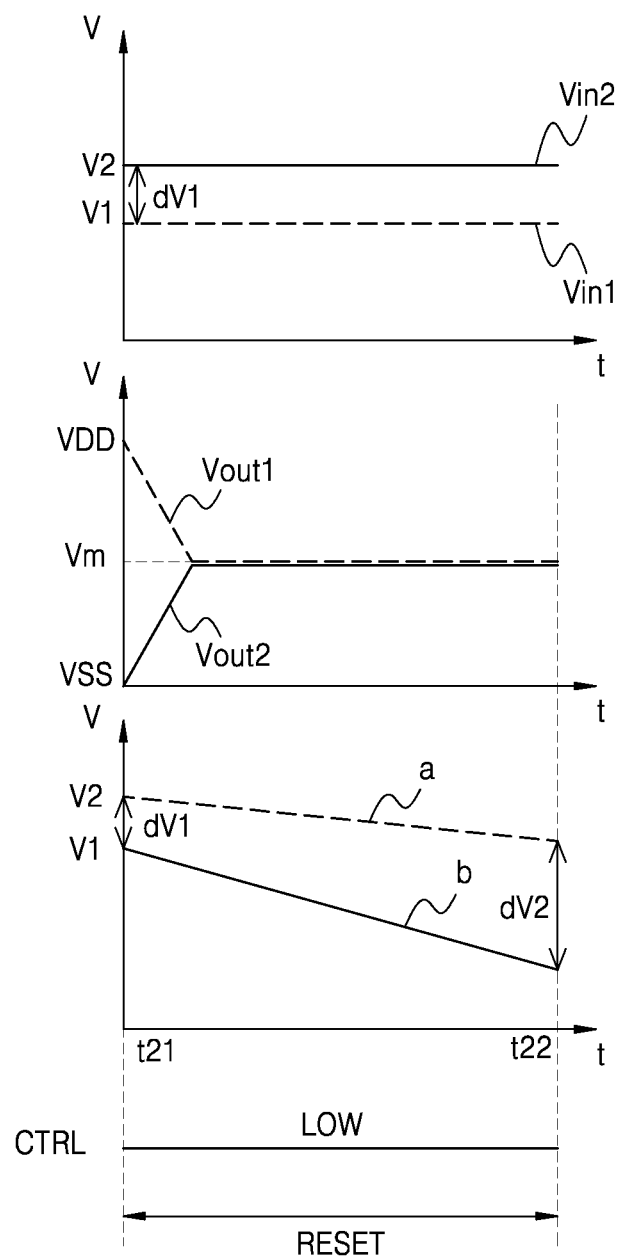

FIGS. 5A and 5B are diagrams illustrating a reset operation according to an embodiment of the inventive concept.

Referring to FIGS. 5A and 5B, FIG. 5A is a circuit diagram of an amplifier circuit performing the reset operation, and FIG. 5B is a timing diagram relating to the reset operation.

Referring to FIG. 5B, the reset operation may be performed between a first time t21 and a second time t22. A signal level of the first input signal Vin1 may be a first level V1, and a signal level of the second input signal Vin2 may be a second level V2. A time period in which the reset operation is performed may be referred to as a reset period, and a time period in which a latch operation is performed may be referred to as a latch period.

Referring to FIGS. 2 and 5A, during the reset operation, the eleventh transistor M11 included in the reset circuit 400b may be turned on. Accordingly, a node of the first output signal Vout1 and a node of the second output signal Vout2 may be connected to each other, and the first and second output signals Vout1 and Vout2 may be maintained at the same signal level.

That is, referring to FIG. 5B, signal levels of the first and second output signals Vout1 and Vout2 may be a middle level Vm, which is a signal level corresponding to the middle voltage level between the positive supply power VDD and the negative supply power VSS.

Referring to FIGS. 2 and 5A, during the reset operation, the seventh and ninth transistors M7 and M9 included in the charge circuit 300b may be turned on, and the eighth and tenth transistors M8 and M10 may be turned off. Accordingly, the first middle node a may be precharged to the first level V1, and the second middle node b may be precharged to the second level V2.

Referring to FIG. 5A, the second input signal Vin2 is received by a gate terminal of the second transistor M2, and the first input signal Vin1 is received by a gate terminal of the first transistor M1. Thus, more channel current may flow through the second transistor M2 than through the first transistor M1. Accordingly, a signal level difference between the first middle node a and the second middle node b may increase over time.

That is, referring to FIG. 5B, at the first time t21, the signal level difference between the first and second middle nodes a and b may be a first level dV1. At the second time t22, the signal level difference between the first middle node a and the second middle node b may be a second level dV2. The second level dV2 may be greater than the first level dV1.

The control signal CTRL may transition to a second logic level at the second time t22, and when the logic level transitions, the signal level difference between the first and second middle nodes a and b may be greater than a signal level difference between the first and second input signals Vin1 and Vin2.

Figure 6A:
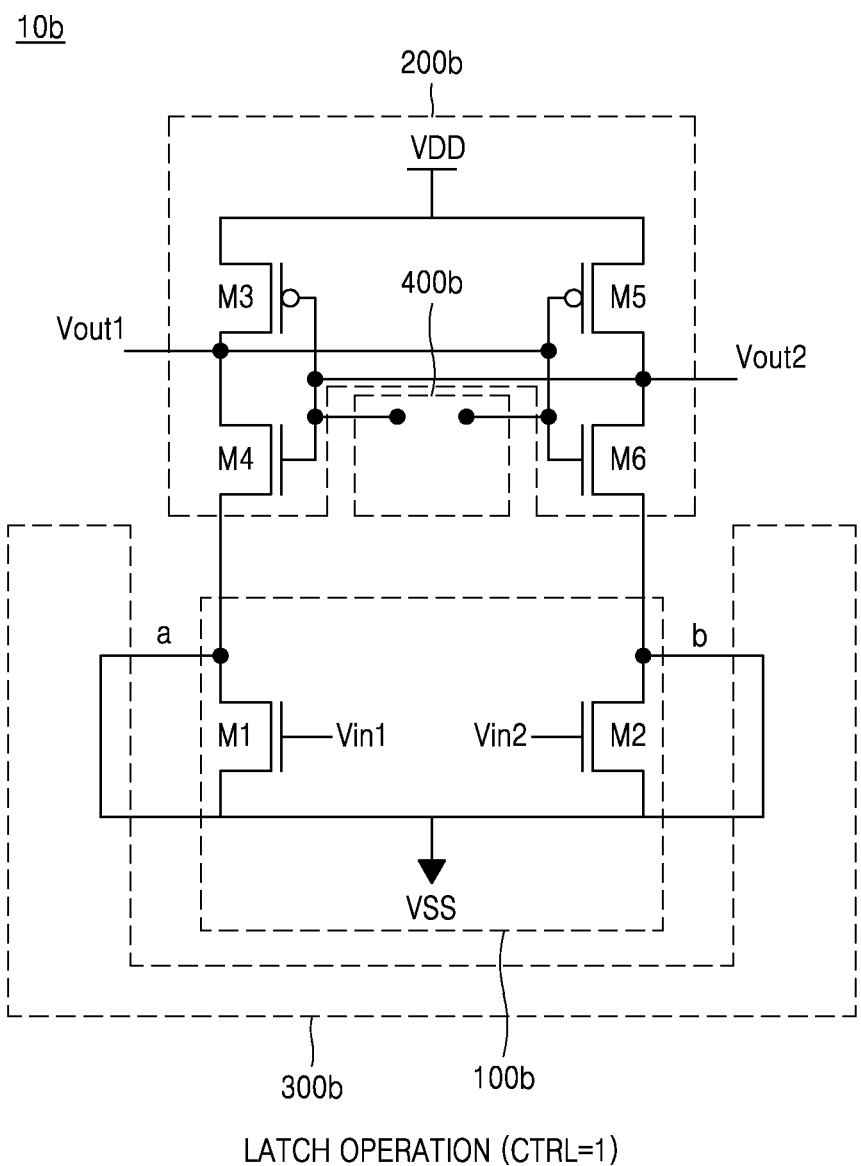
FIGS. 6A and 6B are diagrams illustrating a latch operation according to an embodiment of the inventive concept.
Figure 6B:
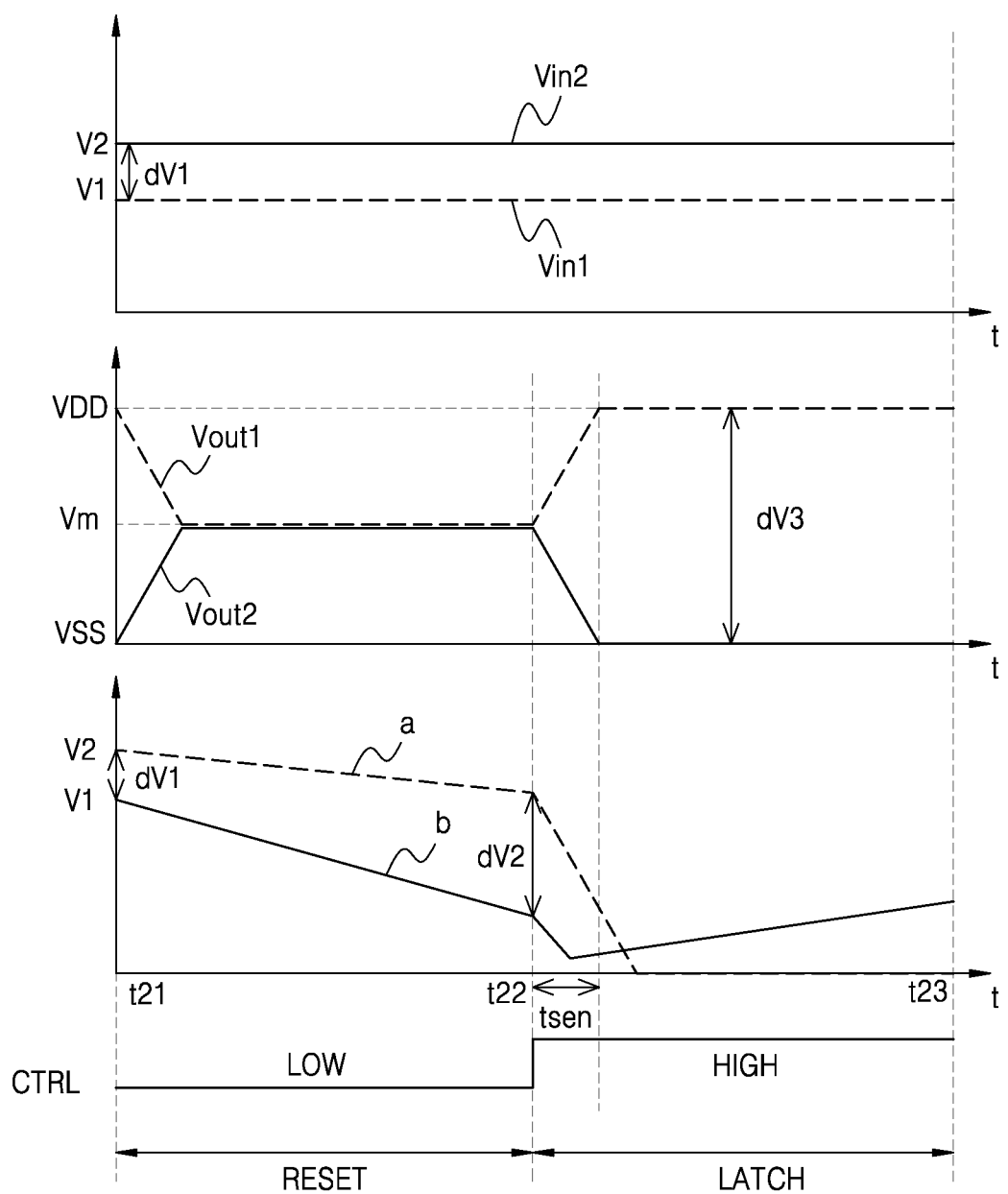

FIGS. 6A and 6B are diagrams illustrating a latch operation according to an embodiment of the inventive concept.

Referring to FIGS. 6A and 6B, FIG. 6A is a circuit diagram of an amplifier circuit that performs the latch operation after a reset operation, and FIG. 6B is a timing diagram between the reset operation and the latch operation.

Referring to FIG. 6B, the latch operation may be performed between the second time t22 and a third time t23.

Referring to FIGS. 2 and 6A, during the latch operation, the eleventh transistor M11 included in the reset circuit 400b may be turned off. Accordingly, a node of the first output signal Vout1 and a node of the second output signal Vout2 may be separated from each other, and the latch operation of amplifying the first and second output signals Vout1 and Vout2 may be performed.

That is, referring to FIG. 6B, during the latch operation, the first output signal Vout1 may be amplified with the positive supply power VDD, and the second output signal Vout2 may be amplified with the negative supply power VSS. A time taken from when the control signal CTRL transitions to a second logic level until the first output signal Vout1 is amplified to a signal level corresponding to the positive supply power VDD may be referred to as a sensing time tsen. Alternatively, a time taken from when the control signal CTRL transitions to the second logic level until the second output signal Vout2 is amplified to a signal level corresponding to the negative supply power VSS may be referred to as the sensing time tsen.

In a reset period, signal levels of the first and second output signals Vout1 and Vout2 may be maintained at the middle level Vm. On the contrary, in the reset period, when a signal level of any one of the first and second output signals Vout1 and Vout2 is maintained at the positive supply power VDD or the negative supply power VSS, in a latch period, a signal level of any one of the first and second output signals Vout1 and Vout2 is changed by a difference between the positive supply power VDD and the negative supply power VSS, which may relatively increase the sensing time tsen. According to an embodiment of the inventive concept, in the latch period, the signal levels of the first and second output signals Vout1 and Vout2 change by about half the difference between the positive supply power VDD and the negative supply power VSS, which may relatively decrease the sensing time tsen.

Referring to FIGS. 2 and 6A, during the latch operation, the seventh and ninth transistors M7 and M9 included in the charge circuit 300b may be turned off, and the eighth and tenth transistors M8 and M10 may be turned on. Accordingly, the first middle node a may be discharged through a path connected in parallel with the first transistor M1, and the second middle node b may be discharged through a path connected in parallel with the second transistor M2.

Referring again to FIG. 6B, as the first and second middle nodes a and b are discharged, the first and second output signals Vout1 and Vout2 may be amplified. When the sensing time tsen has elapsed from the second time t22, the signal level of the first output signal Vout1 may be the positive supply power VDD, and the signal level of the second output signal Vout2 may be the negative supply power VSS. The signal level difference between the first and second input signals Vin1 and Vin2 may be the first signal level dV1, and after the sensing time tsen elapses, the signal level difference between the first and second output signals Vout1 and Vout2 may be a third signal level dV3. The third signal level dV3 may be greater than the first signal level dV1. The third signal level dV3 may correspond to a difference between the positive supply power VDD and the negative supply power VSS.

Figure 7:
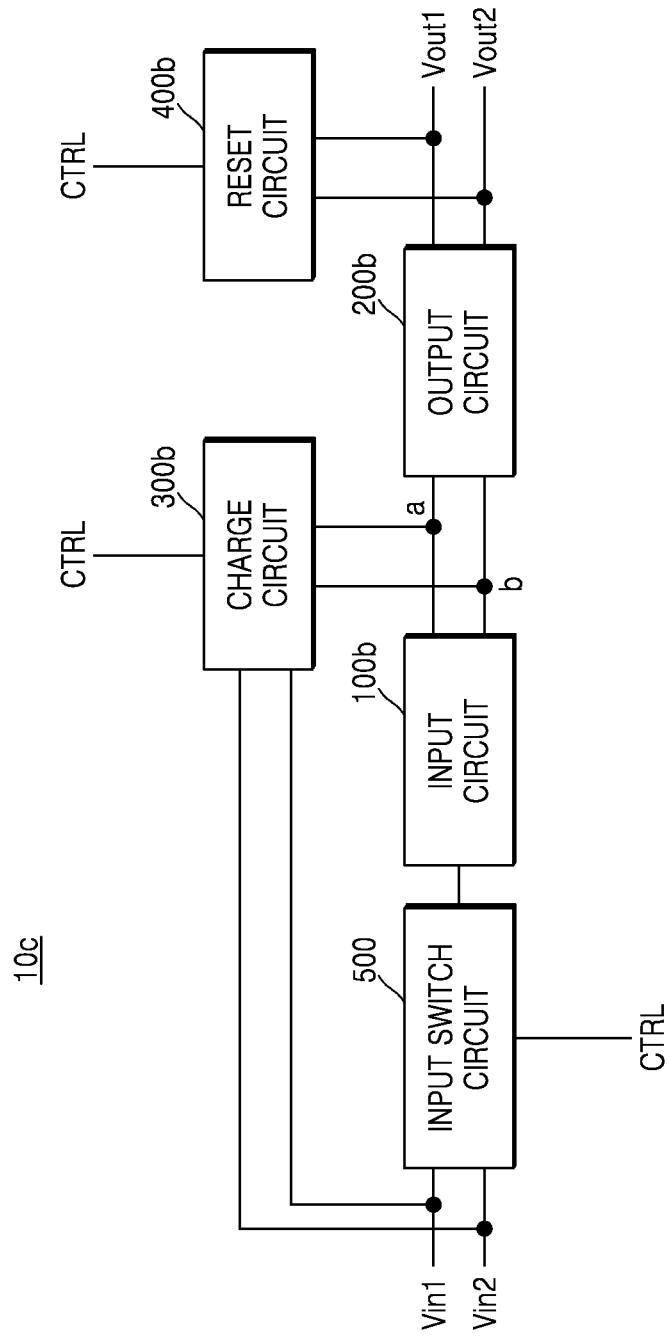
FIG. 7 is a block diagram illustrating an amplifier circuit including an input switch circuit according to an embodiment of the inventive concept.

FIG. 7 is a block diagram illustrating an amplifier circuit including an input switch circuit according to an embodiment of the inventive concept.

Referring to FIG. 7, compared to the amplifier circuit 10b of FIG. 1B, an amplifier circuit 10c may further include an input switch circuit 500.

The input switch circuit 500 may receive the first and second input signals Vin1 and Vin2 and selectively transfer the first and second input signals Vin1 and Vin2 to the input circuit 100b based on the control signal CTRL.

For example, when a logic level of the control signal CTRL is a first logic level, the input switch circuit 500 may block transfer of the first and second input signals Vin1 and Vin2, and when the logic level of the control signal CTRL is a second logic level, the input switch circuit 500 may transfer the first and second input signals Vin1 and Vin2 to the input circuit 100b.

The input circuit 100b may perform a discharge operation based on the first and second input signals Vin1 and Vin2, and consume power during the discharge operation. Accordingly, the amplifier circuit 10c according to an embodiment of the inventive concept includes the input switch circuit 500 that blocks transfer of the first and second input signals Vin1 and Vin2 during a reset operation, which may further reduce power consumption.

Figure 8:
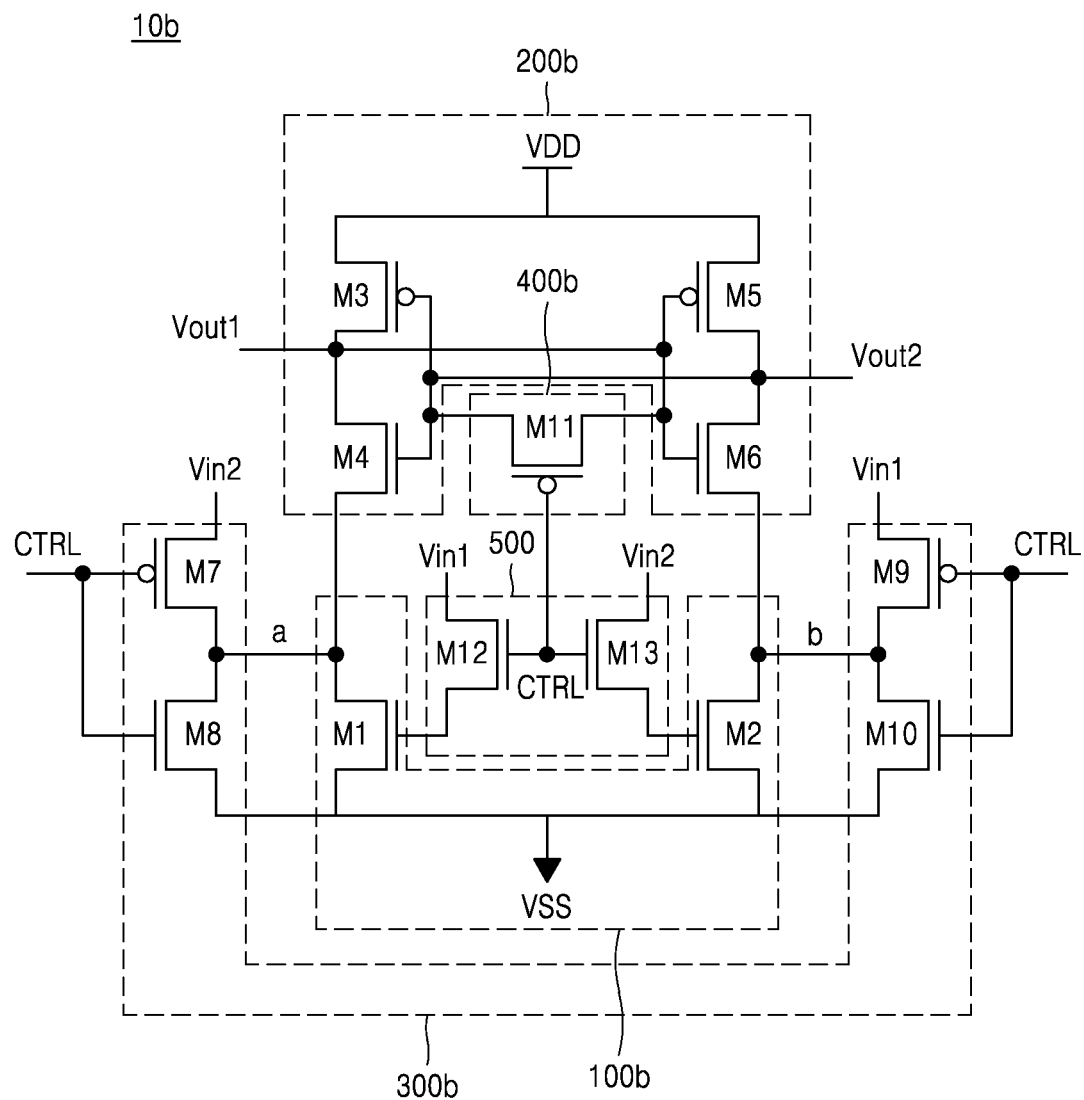
FIG. 8 is a circuit diagram illustrating an amplifier circuit including an input switch circuit according to an embodiment of the inventive concept.

FIG. 8 is a circuit diagram illustrating an amplifier circuit including an input switch circuit according to an embodiment of the inventive concept. For example, FIG. 8 illustrates the amplifier circuit 10b of FIG. 2 including the input switch circuit 500 of FIG. 7.

Referring to FIG. 8, the input switch circuit 500 may include twelfth and thirteenth transistors M12 and M13. The twelfth and thirteenth transistors M12 and M13 may be N-type transistors, but embodiments are not limited thereto.

A source terminal of the twelfth transistor M12 may be connected to a gate terminal of the first transistor M1, the control signal CTRL may be received by a gate terminal thereof, and the first input signal Vin1 may be received by a drain terminal thereof. A source terminal of the thirteenth transistor M13 may be connected to a gate terminal of the second transistor M2, the control signal CTRL may be received by the gate terminal thereof, and the second input signal Vin2 may be received by a drain terminal thereof.

In an embodiment, when a logic level of the control signal CTRL is a first logic level (e.g., a logic low level), the twelfth and thirteenth transistors M12 and M13 may be turned off, and the first and second input signals Vin1 and Vin2 are not transferred to the first and second transistors M1 and M2. Accordingly, a channel current through the first and second transistors M1 and M2 is not generated, and thus, power consumption may be reduced.

When the logic level of the control signal CTRL is a second logic level (e.g., a logic high level), the twelfth and thirteenth transistors M12 and M13 may be turned on, and the first and second input signals Vin1 and Vin2 may be transferred to the first and second transistors M1 and M2. The first and second transistors M1 and M2 may perform a latch operation by discharging the first and second middle nodes a and b.

Figure 9:
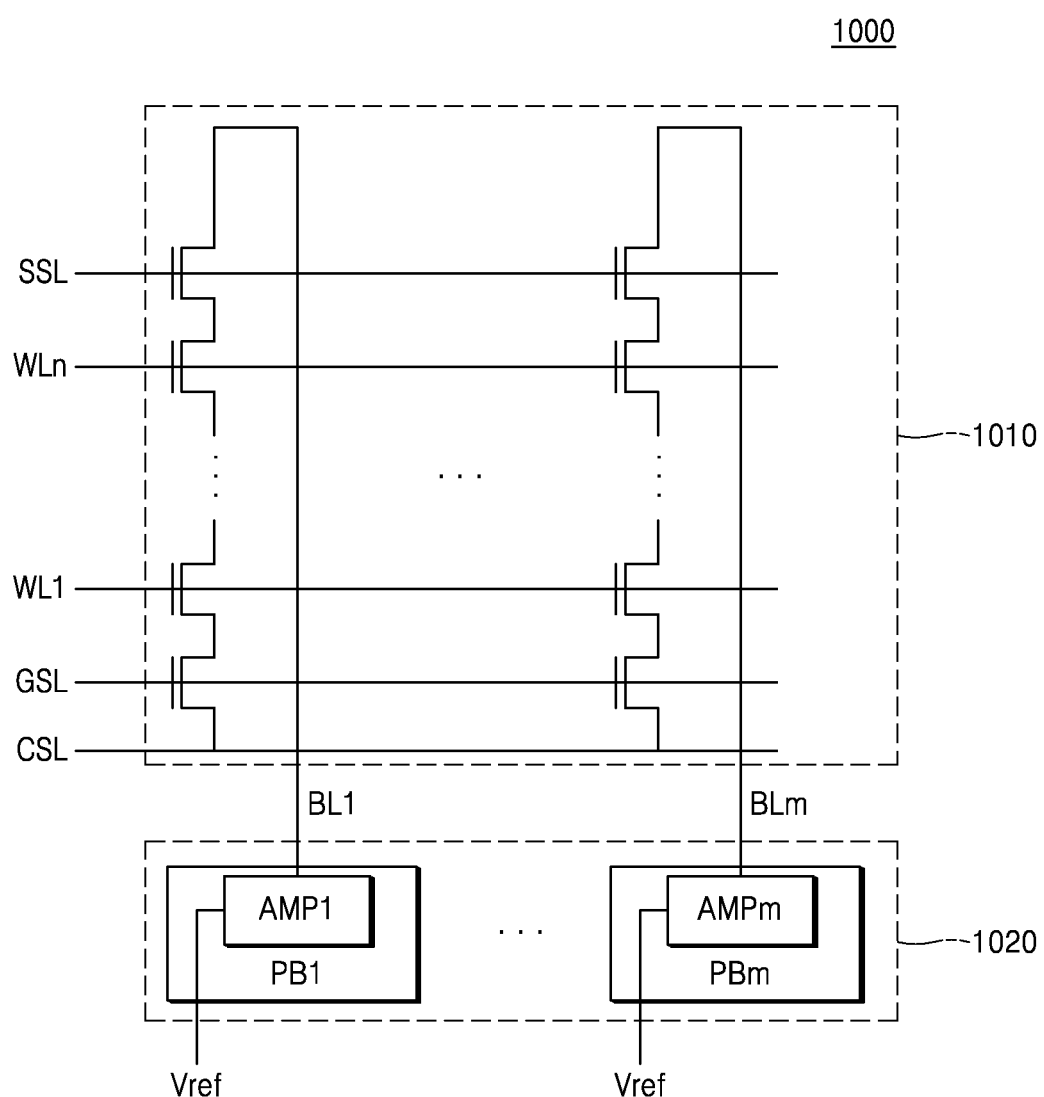
FIG. 9 is a diagram illustrating a memory device including a plurality of amplifier circuits according to an embodiment of the inventive concept.

FIG. 9 is a diagram illustrating a memory device including a plurality of amplifier circuits according to an embodiment of the inventive concept.

Referring to FIG. 9, a memory device 1000 may include a memory cell array 1010 and a page buffer circuit 1020. The memory device 1000 may be a nonvolatile memory device. The memory device 1000 may further include a plurality of amplifier circuits AMP1 to AMPm, in which m is a natural number.

The memory cell array 1010 may include a plurality of memory cells. The memory cell array 1010 may be connected to a plurality of word lines WL1 to WLn, in which n is a natural number, a string selection line SSL, a ground selection line GSL, a common source line CSL, and a plurality of bit lines BL1 to BLm, in which m is a natural number.

The page buffer circuit 1020 may store data to be programmed to the memory cell array 1010 and/or data read from the memory cell array 1010. The page buffer circuit 1020 may operate as a write driver circuit or a sense amplifier circuit according to an operation of the nonvolatile memory device 1000.

The page buffer circuit 1020 may include a plurality of page buffers PB1 to PBm, in which m is a natural number. The plurality of page buffers PB1 to PBm may be respectively connected to the plurality of bit lines BL1 to BLm. The plurality of page buffers PB1 to PBm may include the plurality of amplifier circuits AMP1 to AMPm, respectively. The plurality of amplifier circuits AMP1 to AMPm may be implemented as any one of the amplifier circuits described above with reference to FIGS. 1 to 8.

For example, the first amplifier circuit AMP1 may receive a sensing voltage sensed from the first bit line BL1 and a reference voltage Vref as input signals, and store an amplified output signal in a separate latch or in the output circuit 200b having a latch structure shown in FIG. 2.

The memory device 1000 including the plurality of amplifier circuits AMP1 to AMPm according to an embodiment of the inventive concept may quickly amplify a difference between the sense voltage received from the bit line and the reference voltage Vref, thereby providing a fast read time.

Figure 10:
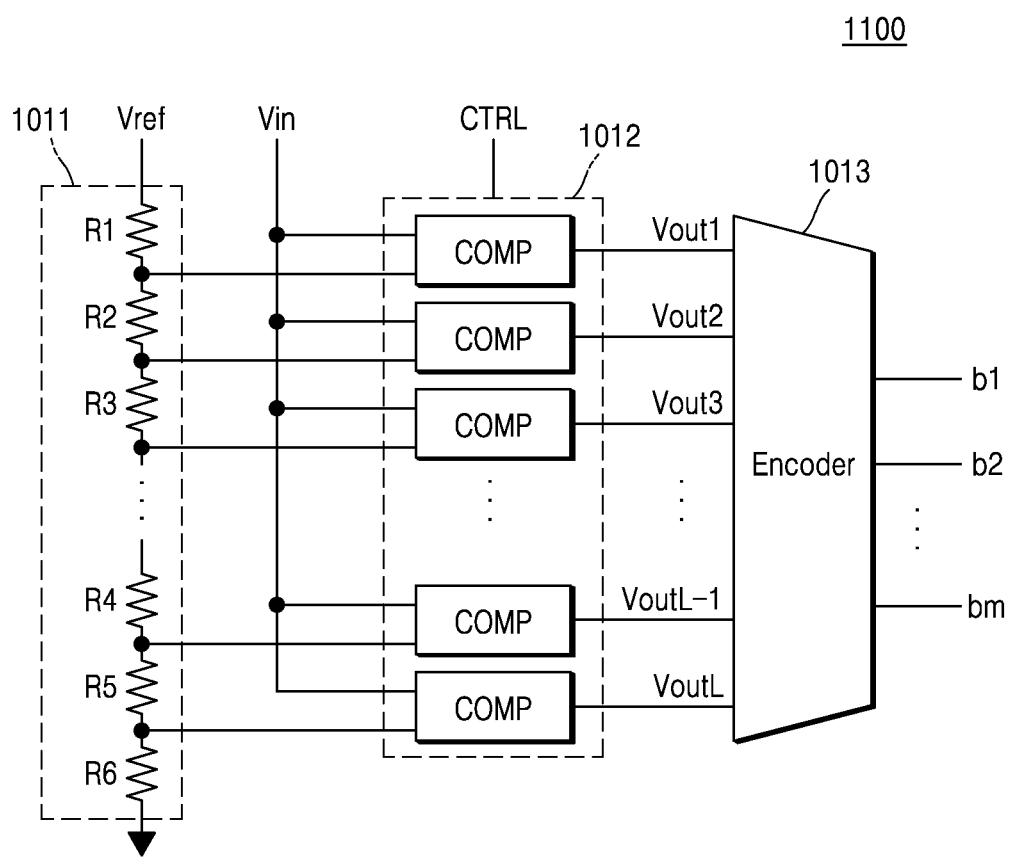
FIG. 10 is a diagram illustrating an analog-to-digital converter including an amplifier circuit according to an embodiment of the inventive concept.

FIG. 10 is a diagram illustrating an analog-to-digital converter including an amplifier circuit according to an embodiment of the inventive concept.

Referring to FIG. 10, an analog-to-digital converter 1100 may convert an analog input signal Vin into digital output signals b1 to bm, in which m is a natural number. The digital output signals b1 to bm may include a plurality of bits.

The analog-to-digital converter 1100 may include a resistor array 1011, a comparator circuit 1012, and an encoder 1013. The comparator circuit 1012 may include a plurality of comparators COMP, and the comparators COMP may correspond to a plurality of amplifier circuits described above with reference to FIGS. 1 to 8.

The resistor array 1011 may include a plurality of resistors R1 to R6. One end of the resistor array 1011 may receive the reference voltage Vref, and the other end may be connected to a ground node. The reference voltage Vref may be distributed to respective nodes formed by the plurality of resistors R1 to R6.

The comparator circuit 1012 may output a plurality of output signals Vout1 to VoutL, in which L is a natural number, by comparing the voltage signal distributed to each node with the analog input signal Vin and amplifying results of comparison. In FIG. 10, the voltage signal and the analog input signal Vin received by each comparator may correspond to the first and second input signals Vin1 and Vin2 described above with reference to FIG. 2, respectively. In FIG. 10, one output signal output by each comparator may be the first output signal Vout1 or the second output signal Vout2 described above with reference to FIG. 2.

The encoder 1013 may receive the plurality of output signals Vout1 to VoutL and generate bit sequences corresponding to the plurality of output signals Vout1 to VoutL as digital output signals b1 to bm.

The analog-to-digital converter 1100 including the amplifier circuit according to an embodiment of the inventive concept may quickly compare the voltage signal distributed to each node of the resistor array 1011 to the analog input signal Vin, thereby providing improved analog-to-digital conversion performance.

While the inventive concept has been particularly shown and described with reference to embodiments thereof, it will be understood that various changes in form and detail may be made therein without departing from the spirit and scope of the inventive concept as defined by the following claims.

What is claimed is:

1. An amplifier circuit, comprising:
   an input circuit configured to receive first and second input signals and control signal levels of first and second nodes,
   wherein the input circuit comprises a first transistor connected to the first node and configured to receive the first input signal and a second transistor connected to the second node and configured to receive the second input signal;
   an output circuit configured to generate signal levels of first and second output signals based on the signal level of the first node and the signal level of the second node;
   a charge circuit configured to precharge the first and second nodes or discharge the first and second nodes based on a logic level of a control signal; and
   a reset circuit configured to maintain the signal levels of the first and second output signals at previously determined signal levels based on the logic level of the control signal.

2. The amplifier circuit of claim 1, wherein the charge circuit comprises:
   a first charge circuit configured to precharge the first node to a signal level of the second input signal in response to the control signal having a first logic level; and
   a second charge circuit configured to precharge the second node to a signal level of the first input signal in response to the control signal having the first logic level.

3. The amplifier circuit of claim 2, wherein the first charge circuit is configured to discharge the first node in response to the control signal having a second logic level,
   wherein the second charge circuit is configured to discharge the second node in response to the control signal having the second logic level.

4. The amplifier circuit of claim 3, wherein the first charge circuit comprises:
   a third transistor having a gate terminal that receives the control signal, a source terminal that receives the second input signal, and a drain terminal connected to the first node; and
   a fourth transistor having a gate terminal that receives the control signal, a source terminal connected to a ground node, and a drain terminal connected to the first node,
   wherein the second charge circuit comprises:
   a fifth transistor having a gate terminal that receives the control signal, a source terminal that receives the first input signal, and a drain terminal connected to the second node; and
   a sixth transistor having a gate terminal that receives the control signal, a source terminal connected to the ground node, and a drain terminal connected to the second node.

5. The amplifier circuit of claim 1, wherein the reset circuit comprises a second transistor configured to connect a first output node configured to generate the first output signal and a second output node configured to generate the second output signal in response to the control signal having a first logic level.

6. The amplifier circuit of claim 5, wherein each of the first and second output signals has a first signal level or a second signal level in response to the control signal having a second logic level, and has a middle voltage level between the first signal level and the second signal level in response to the control signal having the first logic level.

7. The amplifier circuit of claim 1, wherein the input circuit comprises:
   the first transistor having a drain terminal connected to the first node, a source terminal connected to a ground node, and a gate terminal that receives the first input signal; and
   the second transistor having a drain terminal connected to the second node, a source terminal connected to the ground node, and a gate terminal that receives the second input signal,
   wherein a signal level of the first input signal is lower than a threshold voltage level of the first transistor,
   wherein a signal level of the second input signal is lower than a threshold voltage level of the second transistor.

8. The amplifier circuit of claim 1, further comprising:
   an input switch circuit configured to selectively transfer the first and second input signals to the input circuit based on the logic level of the control signal.

9. The amplifier circuit of claim 8, wherein the input circuit comprises:
   the first transistor having a drain terminal connected to the first node, a source terminal connected to a ground node, and a gate terminal that receives the first input signal; and
   the second transistor having a drain terminal connected to the second node, a source terminal connected to the ground node, and a gate terminal that receives the second input signal,
   wherein a signal level of the first input signal is lower than a threshold voltage level of the first transistor,
   wherein a signal level of the second input signal is lower than a threshold voltage level of the second transistor,
   wherein the input switch circuit comprises:
   a third transistor having a drain terminal that receives the first input signal, a gate terminal that receives the control signal, and a source terminal connected to the gate terminal of the first transistor; and
   a fourth transistor having a drain terminal that receives the second input signal, a gate terminal that receives the control signal, and a source terminal connected to the gate terminal of the second transistor.

10. An amplifier circuit, comprising:
    an input circuit configured to receive first and second input signals and control signal levels of first and second nodes,
    wherein the input circuit comprises a first transistor connected to the first node and configured to receive the first input signal and a second transistor connected to the second node and configured to receive the second input signal;
    an output circuit configured to generate signal levels of first and second output signals based on the signal level of the first node and the signal level of the second node;
    a charge circuit configured to precharge the first and second nodes or discharge the first and second nodes based on a logic level of a control signal; and
    an input switch circuit configured to selectively transfer the first and second input signals to the input circuit based on the logic level of the control signal.

11. The amplifier circuit of claim 10, wherein the input circuit comprises:
    the first transistor having a drain terminal connected to the first node, a source terminal connected to a ground node, and a gate terminal that receives the first input signal; and the second transistor having a drain terminal connected to the second node, a source terminal connected to the ground node, and a gate terminal that receives the second input signal,
wherein a signal level of the first input signal is lower than a threshold voltage level of the first transistor,
wherein a signal level of the second input signal is lower than a threshold voltage level of the second transistor.

12. The amplifier circuit of claim 11, wherein the charge circuit is configured to precharge the first node to a signal level of the second input signal and precharge the second node to a signal level of the first input signal in response to the control signal having a first logic level, and
discharge the first node and the second node in response to the control signal having a second logic level.

13. The amplifier circuit of claim 12, wherein the charge circuit comprises:
a third transistor having a gate terminal that receives the control signal, a source terminal that receives the second input signal, and a drain terminal connected to the first node;
a fourth transistor having a gate terminal that receives the control signal, a source terminal connected to the ground node, and a drain terminal connected to the first node;
a fifth transistor having a gate terminal that receives the control signal, a source terminal that receives the first input signal, and a drain terminal connected to the second node; and
a sixth transistor having a gate terminal that receives the control signal, a source terminal connected to the ground node, and a drain terminal connected to the second node.

14. The amplifier circuit of claim 13, wherein the input switch circuit is configured to block transfer of the first and second input signals in response to the control signal having the first logic level, and transfer the first input signal to the first transistor and transfer the second input signal to the second transistor in response to the control signal having the second logic level.

15. The amplifier circuit of claim 14, wherein the input switch circuit comprises:
a seventh transistor having a drain terminal that receives the first input signal, a gate terminal that receives the control signal, and a source terminal connected to the gate terminal of the first transistor; and
and an eighth transistor having a drain terminal that receives the second input signal, a gate terminal that receives the control signal, and a source terminal connected to the gate terminal of the second transistor.

16. The amplifier circuit of claim 10, further comprising:
a reset circuit configured to selectively connect a first output node configured to generate the first output signal and a second output node configured to generate the second output signal based on the logic level of the control signal.

17. An amplifier circuit configured to perform a reset operation of maintaining first and second output signals at previously determined signal levels and a latch operation of generating the first and second output signals respectively corresponding to the first and second input signals, comprising:
an input circuit configured to receive first and second input signals and control signal levels of first and second nodes,
wherein the input circuit comprises a first transistor connected to the first node and configured to receive the first input signal and a second transistor connected to the second node and configured to receive the second input signal,
an output circuit configured to output the first and second output signals in which the signal levels of the first and second input signals are amplified based on the signal levels of the first and second nodes during the latch operation;
a charge circuit configured to precharge the first and second nodes during the reset operation and discharge the first and second nodes during the latch operation; and
a reset circuit configured to maintain signal levels of the first and second output signals at signal levels corresponding to about half of a sum of a positive power voltage and a negative power voltage during the reset operation.

18. The amplifier circuit of claim 17, further comprising:
an input switch circuit configured to block the first and second input signals transferred to the input circuit during the reset operation and transfer the first and second input signals to the input circuit during the latch operation.

19. The amplifier circuit of claim 17, wherein the input circuit is configured to control a difference between the signal level of the first node and the signal level of the second node to a first level at a start time of the reset operation, and
control the difference between the signal level of the first node and the signal level of the second node to a second level at a start of the latch operation,
wherein the second level is less than the first level.

20. The amplifier circuit of claim 17, wherein the charge circuit is configured to precharge the first node to the second input signal during the reset operation, precharge the second node to the first input signal, and discharge the first and second nodes during the latch operation.

* * * * *